(12) United States Patent
Pawlak et al.

(10) Patent No.: US 7,348,229 B2
(45) Date of Patent: Mar. 25, 2008

(54) METHOD OF MANUFACTURING A SEMICONDUCTOR DEVICE AND SEMICONDUCTOR DEVICE OBTAINED WITH SUCH A METHOD

(75) Inventors: Bartlomiej Jan Pawlak, Leuven (BE); Raymond James Duffy, Leuven (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/596,450

(22) PCT Filed: Nov. 29, 2004

(86) PCT No.: PCT/IB2004/052578

§ 371 (c)(1),
(2), (4) Date: Jun. 14, 2006

(87) PCT Pub. No.: WO2005/062353

PCT Pub. Date: Jul. 7, 2005

(65) Prior Publication Data

US 2007/0105291 A1     May 10, 2007

(30) Foreign Application Priority Data

Dec. 18, 2003   (EP) ................................. 03104776

(51) Int. Cl.
*H01L 21/336* (2006.01)
*H01L 21/8234* (2006.01)

(52) U.S. Cl. ...................... 438/197; 438/514; 438/663; 257/E21.17; 257/E21.051; 257/E21.092; 257/E21.248; 257/E21.315; 257/E21.324

(58) Field of Classification Search ................ 438/197, 438/149, 510, 513, 514, 505, 506, 508, 482, 438/495, 499, 663, 680, 733, 734
See application file for complete search history.

(56) References Cited

U.S. PATENT DOCUMENTS

| | | | |
|---|---|---|---|
| 5,648,287 A * | 7/1997 | Tsai et al. .................... | 438/663 |
| 6,080,630 A * | 6/2000 | Milic-Strkalj et al. ....... | 438/305 |
| 6,096,586 A * | 8/2000 | Milic-Strkalj et al. ....... | 438/174 |
| 6,156,615 A * | 12/2000 | Kepler ......................... | 438/305 |
| 6,207,482 B1 * | 3/2001 | Shih et al. ................... | 438/199 |
| 6,432,802 B1 * | 8/2002 | Noda et al. .................. | 438/585 |

* cited by examiner

*Primary Examiner*—David Nhu
(74) *Attorney, Agent, or Firm*—Peter Zawilski

(57) ABSTRACT

The invention relates to a method of manufacturing a semiconductor device (10) with a field effect transistor, in which method a semiconductor body (1) of silicon is provided at a surface thereof with a source region (2) and a drain region (3) of a first conductivity type, which both are provided with extensions (2A,3A) and with a channel region (4) of a second conductivity type, opposite to the first conductivity type, between the source region (2) and the drain region (3) and with a gate region (5) separated from the surface of the semiconductor body (1) by a gate dielectric (6) above the channel region (4), and wherein a pocket region (7) of the second conductivity type and with a doping concentration higher than the doping concentration of the channel region (4) is formed below the extensions (2A,3A), and wherein the pocket region (7) is formed by implanting heavy ions in the semiconductor body (1), after which implantation a first annealing process is done at a moderate temperature and a second annealing process with fast ramp-up is done at a higher temperature. According to the invention, the method is characterized in that between the two annealing processes amorphous silicon in the semiconductor body (1) is intentionally kept present in a surface region of the semiconductor body (1) which extends from the surface of the semiconductor body up to about the projected range of the implanted pocket region (7). This may be obtained by e.g. timely interrupting the first annealing process or by making the relevant region amorphous by an implantation of inert ions between the first and the second annealing process. In this way a very abrupt and narrow doping profile in the pocket region (7) is obtained, which is advantageous for future CMOS devices.

9 Claims, 3 Drawing Sheets

Figure 1:
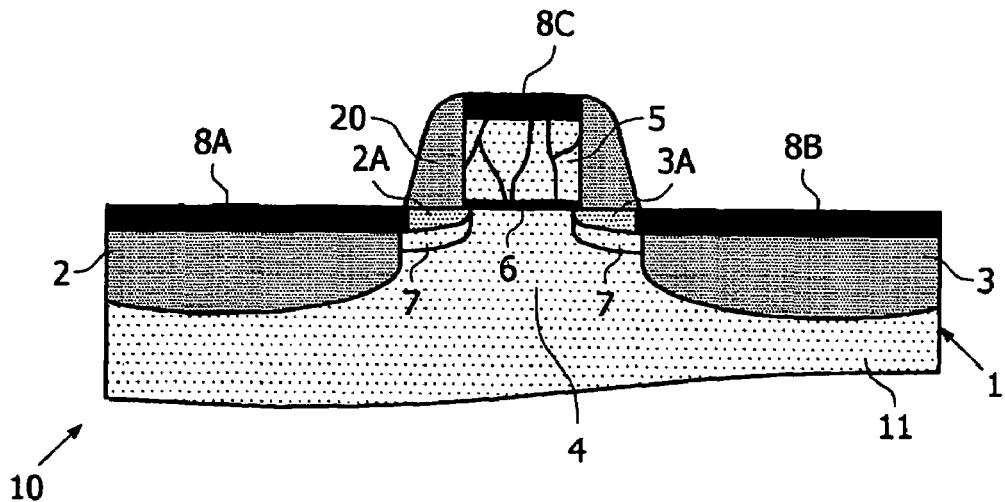
Figure 2:
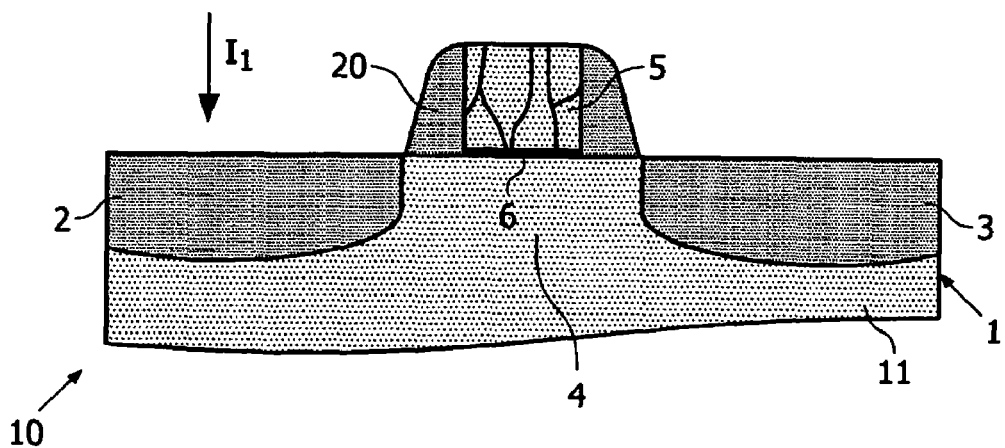
Figure 3:
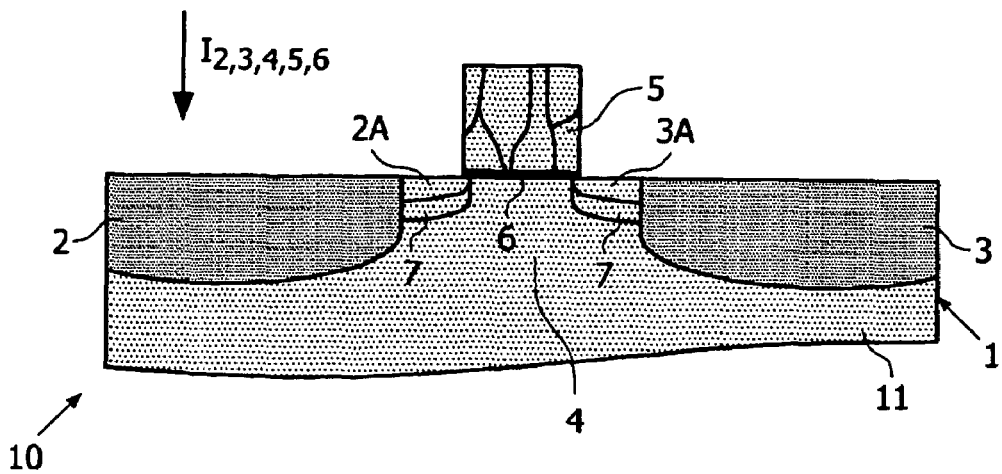
Figure 4:
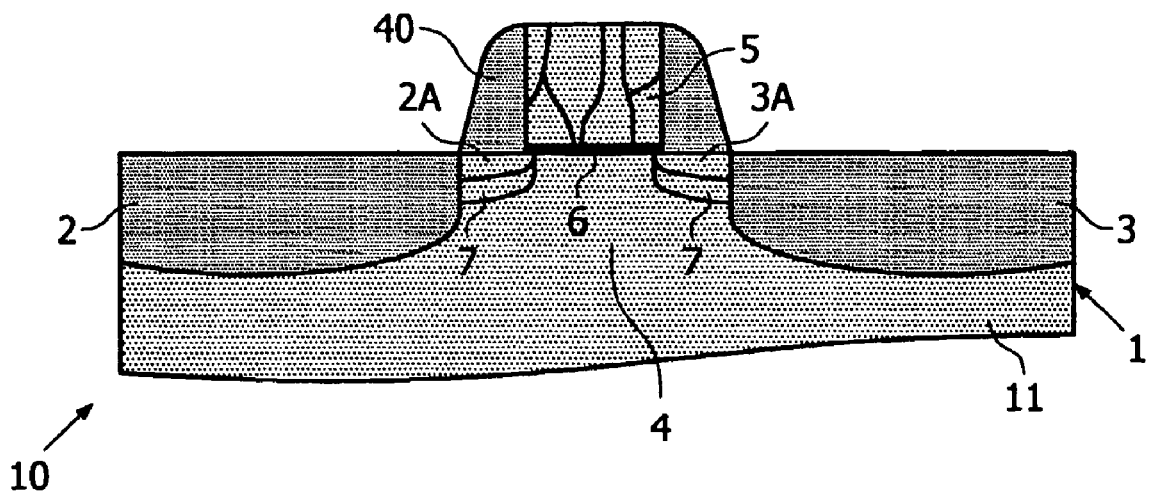
Figure 5:
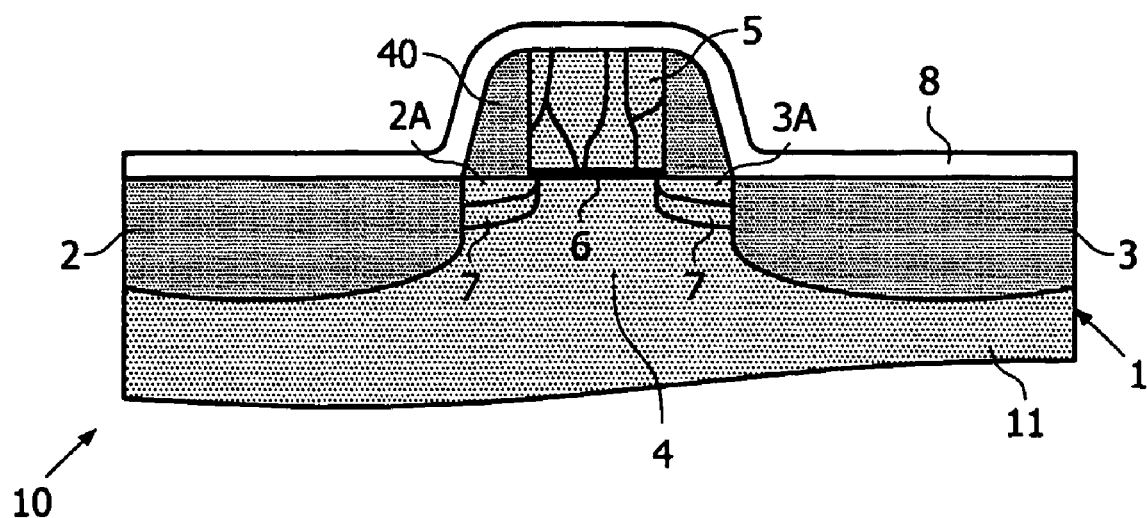

METHOD OF MANUFACTURING A SEMICONDUCTOR DEVICE AND SEMICONDUCTOR DEVICE OBTAINED WITH SUCH A METHOD

This application is a 371 of PCT/IB04/52578 filed Nov. 29, 2004.

The invention relates to a method of manufacturing a semiconductor device with a field effect-transistor, in which method a semiconductor body of silicon is provided at a surface thereof with a source region and a drain region of a first conductivity type, which both are provided with extensions and with a channel region of a second conductivity type, opposite to the first conductivity type, between the source region and the drain region and with a gate region separated from the surface of the semiconductor body by a gate dielectric above the channel region, and wherein a pocket region of the second conductivity type and with a doping concentration higher than the doping concentration of the channel region is formed below the extensions, and wherein the pocket region is formed by implanting heavy ions in the semiconductor body, after which implantation a first annealing process is done at a moderate temperature and a second annealing process with a fast ramp-up is done at a higher temperature. Such a method is very suitable for making MOSFET (=Metal Oxide Semiconductor Field Effect Transistor) devices. In the future CMOS (=Complimentary MOS) technology the formation of so-called pocket implants will become very essential since they have influence on the ion current of the transistor.

A method as mentioned in the opening paragraph is known from U.S. Pat. No. 6,432,802 B1 that has been issued on Aug. 13, 2002. Therein (see embodiment 1 described in columns 6 and 7) such a method is described in which shallow extensions of source and drain are formed by doping, in this case, n-type ions into a semiconductor body. In addition, a p-type pocket dopant layer is formed under the extensions by doping with heavy ions, in this case indium ions. Next, a first annealing process is applied at a low temperature between 400 and 550 degrees Celsius, thereby changing the amorphous layer, i.e. a layer with (heavy) crystal damage, in the semiconductor body into a crystalline layer. Thereafter a second annealing process is done in the form of an RTA (=Rapid Thermal Annealing) in which the semiconductor body is heated up to an elevated temperature between 950 and 1050 degrees Celsius. In this way the highly doped extensions and the pocket implanted region are annealed and diffused.

A drawback of such a method is that the beneficial effect of the pocket implanted region is not optimal as the abruptness and localization in space is not sufficient for future CMOS devices.

It is therefore an object of the present invention to avoid the above drawbacks and to provide a method which does provide satisfactory results for very small devices and in which the implanted pocket region is very abrupt and localized in space.

To achieve this, a method of the type described in the opening paragraph is characterized in that between the two annealing processes, amorphous silicon in the semiconductor body is intentionally kept present in a surface region of the semiconductor body which extends from the surface of the semiconductor body up to about the projected range of the implanted pocket region. The present invention is firstly based on the recognition that during the first annealing process, re-growth of the crystal in the semiconductor occurs starting from a deeper, undamaged region in the semiconductor body and that this re-growth, provided that it occurs at the right temperature, is accompanied by a favorable effect with respect to the profile of the heavy ions of the pocket region. Due to a more limited solubility of these impurities in the re-grown crystal, they are pushed forward of the front-line of the re-growing crystal. In this way the peak concentration of the profile of the heavy ions can be increased. The invention is further based on the recognition that in the second annealing process this beneficial effect is partly destroyed because—as the inventor realized—the second annealing process implies that the semiconductor body will be subject to temperatures between the moderate temperature and the high temperature.

The inventor realizes that these intermediate temperatures, even if the time during which the semiconductor body is exposed to such temperatures is very short, have as a result that the beneficial effect with respect to the peak concentration of the heavy ions is partly annihilated thereby. By intentionally keeping amorphous silicon present near the projected range of the implanted pocket region, the above detrimental effect of the intermediate temperatures can be avoided since the transient intermediate temperatures now will serve only to re-crystallize the damaged region of the semiconductor body, roughly lying below the implanted pocket region, and at the time when the re-crystallization reaches the peak of the profile of the heavy ions, the temperature in the second annealing process will have reached its final, high value at which the above detrimental effect does not occur. Thus, in a device obtained with a method according to the invention, a more abrupt and steep profile of the heavy ions of the implanted pocket region is obtained.

In a first embodiment of a method according to the invention, the above effect is obtained in that the first annealing process is stopped at the moment that re-growth of the semiconductor body starting from the deepest border of a region comprising amorphous silicon reaches about the projected range of the implanted pocket region. In this way, the desired result is obtained in a very simple way in which no additional steps are needed.

In a second embodiment all amorphous silicon in the semiconductor body is removed during the first annealing process and an implantation of inert ions that re-introduces amorphous silicon into the semiconductor body at least in a region beyond the projected range of the implanted pocket region is applied between the first and the second annealing process. The advantage of this embodiment is that it implies a more easily controllable and well reproducible process. The process is hardly more complex as it requires no additional masks because the implantation of the inert ions can be done using the masking present at that stage of the manufacturing.

The amount of damage in the crystal of the semiconductor body, i.e. the degree of amorphization, at the beginning of the first annealing process depends on the damage introduced during the implantation of the pocket region. For high concentrations of the pocket doping, the pocket implantation itself will create a large region with amorphous silicon. For lower concentrations of heavy ions this is not the case, or to a lesser degree. In such a case, the semiconductor body may be made amorphous in the relevant region by another implantation of inert ions preceding the implantation of the pocket region.

Preferably, for either of the implantations of inert ions, ions are chosen from a group comprising Ge, Si, Ar or Xe. Germanium has proven to be a very suitable inert ion in the case of a semiconductor body comprising silicon. For the heavy ions, ions like gallium or indium may be considered. Very favorable results however are obtained when using indium ions as the heavy ions.

A suitable temperature for the first annealing process has been found to lie in the range between 550 and 650 degrees Celsius. The second annealing process is preferably done at a temperature higher than about 900 degrees Celsius. For the latter an RTA process is most suitable to obtain a flash or spike activation of the pocket region.

In a favorable further embodiment the pocket region and the extensions of the source and drain are formed at the same stage of the manufacturing of the semiconductor device.

The invention further comprises a semiconductor device with a field effect transistor which is obtained using a method according to the invention. In such a device the pocket region may have a very abrupt and narrow doping profile.

Figure 6:
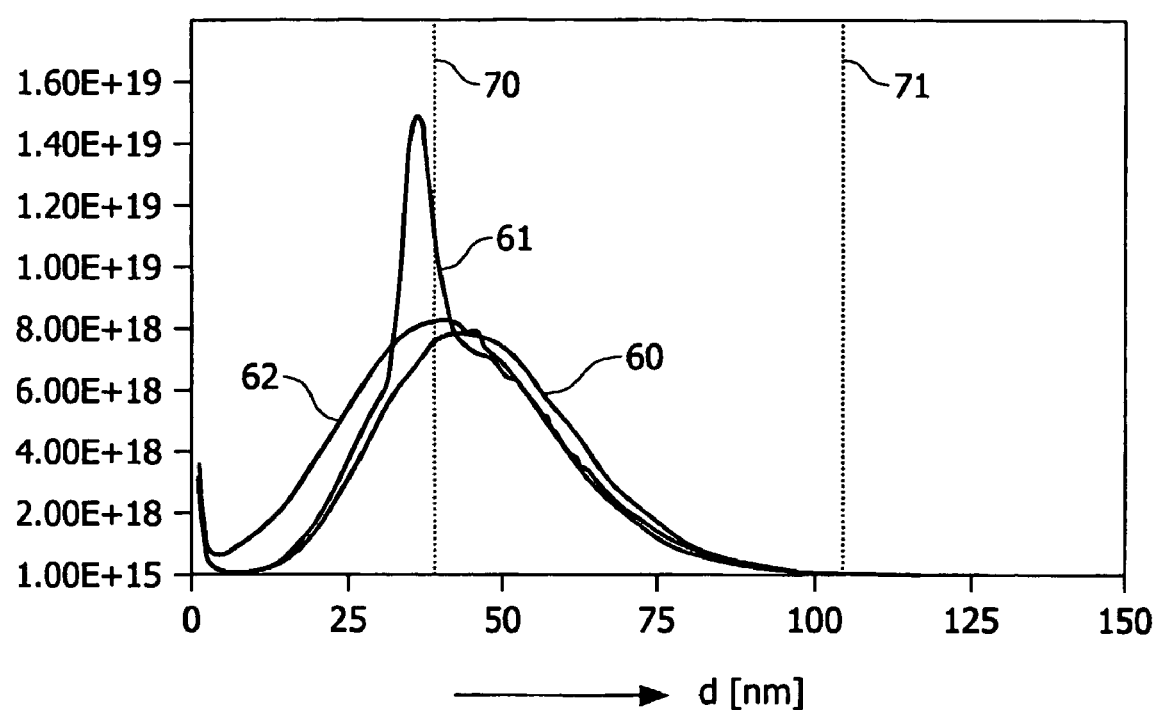

These and other aspects of the invention will be apparent from and elucidated with reference to the embodiments described hereinafter, to be read in conjunction with the drawing, in which FIG. 1 is sectional view of a semiconductor device obtained using a method according to the invention, FIGS. 2 through 5 are sectional views of the semiconductor device of FIG. 1 at various stages in the manufacture of the device by means of a method in accordance with the invention, and FIG. 6 shows various doping profiles in the pocket region of the device of FIG. 1 for various times of annealing at a low temperature.

The figures are diagrammatic and not drawn to scale, the dimensions in the thickness direction being particularly exaggerated for greater clarity. Corresponding parts are generally given the same reference numerals and the same hatching in the various figures.

FIG. 1 is sectional view of a semiconductor device obtained with a method according to the invention. The device 10, which is in this case an NMOST, comprises a semiconductor body 1 that is made of silicon. The device 10 contains in practice, near its borders, isolation regions such as a so-called trench or LOCOS (=Local Oxidation of Silicon) isolation, which are not shown in the drawing, however. In practice the device 10 will contain many transistors of both the NMOS and PMOS type. At the surface of the semiconductor body are present a, in this case n-type, source region 2 and drain region 3 provided with—also n-type—extensions 2A, 3A that are more shallow and border a, in this case p-type, channel region 4 above which a dielectric region 6 is present, here comprising silicon dioxide, which separates the channel region 4 from a gate region 5, here comprising polycrystalline silicon. The gate region 5 is bordered by spacers 20, in this case also of silicon dioxide. On top of the source, drain and gate regions (2,3,5) a metal silicide (8A,8B,8C) is present that serves as a connection region.

FIGS. 2 through 5 are sectional views of the semiconductor device of FIG. 1 at various stages in the manufacture of the device by means of a method in accordance with the invention. The starting point for the manufacture of the device 10 is (see FIG. 2) a p-type silicon substrate 11—in which an n-type so-called well may be formed for PMOS transistors—which here also forms the semiconductor body 1. In the body 1 isolation regions—not shown in the drawing—are formed. Subsequently, on the surface of the silicon body 1 a gate dielectric 6 of a silicon oxide is formed, in this case by means thermal oxidation. Next, a polycrystalline silicon layer 5 is deposited on the gate dielectric layer 6 by means of CVD in a usual manner. Its thickness is, in this example, 100 nm. A mask—not shown in the drawing—is deposited on the structure at the area of the gate 5 to be formed, said mask e.g. comprising a resist and being formed by means of photolithography. Outside the mask the layers 5, 6 are removed by means of etching and in this way the gate stack, comprising gate 5 and gate dielectric 6, is formed.

Subsequently spacers 20, e.g. of silicon dioxide, are formed at both sides of the gate stack by depositing a uniform layer of said material on the device 10 and by anisotropic etching thereof such that it is again removed in the planar regions of the device. Now a deeper n+ type implantation $I_1$ is done in order to form source and drain 2,3. The semiconductor body is then annealed at a temperature of >1000° C. in order to activate the source and drain implantations.

The spacers 20 then (see FIG. 3) have to be removed before making the extensions 2A, 3A and the pocket regions 7. This is done in this example by a series of ion implantations $I_{2,3,4,5,6}$. A first implantation comprises amorphization of a part of the semiconductor body and is done by implanting germanium ions into the semiconductor body 1. A second implantation, in this example an arsenic ion implantation, is done to form the extensions 2A, 3A. Subsequently, a third implantation of heavy ions, in this case of indium ions, is done in order to form the pocket region 7. Next, the amorphous silicon of the implantations is recovered in a first annealing process at a temperature between 550 and 650 degrees Celsius. In this way a very abrupt and narrow profile of the indium atoms in the pocket region 7 is obtained. Then a second amorphization of the semiconductor body 1 is obtained by a sixth implantation which comprises again the implantation of germanium ions. Then, a second annealing process in the form of an RTA process is applied in order to activate the dopants of, in particular, the pocket region 7. Thanks to the fact that the semiconductor body 1 comprises amorphous silicon due to the second germanium implantation (the sixth implantation), the intermediate temperatures, which unavoidably reach the high, i.e. higher than 950 degrees Celsius, temperature in the RTA process, do not spoil the abrupt and narrow profile of the indium atoms in the pocket region 7.

Subsequently (see FIG. 4), new spacers 40 are formed in a similar way as described above. This is followed (see FIG. 5) by the deposition of a metal layer 8, in this case of nickel, on top of the semiconductor body 1. In a first, low temperature heating cycle, parts of the metal layer 8, react with the silicon present in the source 2, drain 3 and gate 5. The remainder of the metal layer is then removed by etching and the connection regions 8A,8B,8C comprising a nickel monosilicide are subsequently formed in a second heating cycle. The temperatures in the first and second heating cycles may be around 200 and 450 degrees Celsius, respectively. This stage corresponds to the stage shown in FIG. 1.

Finally, the manufacturing of the n-MOSFET is further completed by deposition of a pre-metal dielectric, e.g. of silicon dioxide, followed by patterning thereof, deposition of a contact metal layer, e.g. of aluminum, again followed by patterning, resulting in the formation of contact regions. These steps are not shown in the drawings.

FIG. 6 shows various doping profiles in the pocket region of the device of FIG. 1 for various times of annealing at low temperature. An indium implantation (dose being a few times $10^{13}$ at/cm$^3$, at 90 keV) was done in a silicon wafer that had been pre-amorphized with germanium up to a depth of 105 nm. The curves 60, 61 and 62 show the indium concentration (C) as a function of depth (d) for annealing at 600 degrees Celsius for a time of respectively 10 seconds, 60 seconds and 120 seconds. Curve 61, representing an intermediate annealing time, clearly shows the indium pile up in front of the c-Si/a-Si interface. Such a concentration profile is very suitable for a pocket implant as it is very narrow and abrupt.

It will be obvious that the invention is not limited to the examples described herein, and that within the scope of the invention many variations and modifications are possible to those skilled in the art.

The invention claimed is:

1. Method of manufacturing a semiconductor device (10) with a field effect transistor, in which method a semiconductor body (1) of silicon is provided at a surface thereof with a source region (2) and a drain region (3) of a first conductivity type, which both are provided with extensions (2A,3A), and with a channel region (4) of a second conductivity type, opposite to the first conductivity type, between the source region (2) and the drain region (3) and with a gate region (5) separated from the surface of the semiconductor body (1) by a gate dielectric (6) above the channel region (4), and wherein a pocket region (7) of the second conductivity type and with a doping concentration higher than the doping concentration of the channel region (4) is formed below the extensions (2A,3A), and wherein the pocket region (7) is formed by implanting heavy ions in the semiconductor body (1), after which implantation a first annealing process is done at a moderate temperature and a second annealing process with a fast ramp-up is done at a higher temperature, characterized in that between the two annealing processes, amorphous silicon in the semiconductor body (1) is intentionally kept present in a surface region of the semiconductor body (1) which extends from the surface of the semiconductor body up to about a projected range of the implanted pocket region (7).

2. Method according to claim 1, characterized in that the first annealing process is stopped at a moment that re-growth of the semiconductor body (1), starting from a deepest border of a region comprising amorphous silicon, reaches about the projected range of the implanted pocket region (7).

3. Method according to claim 1, characterized in that in the first annealing process all amorphous silicon in the semiconductor body (1) is removed and that an implantation of inert ions that re-introduces amorphous silicon into the semiconductor body (1), at least in a region around the projected range of the implanted pocket region (7), is applied between the first and the second annealing processes.

4. Method according to claim 1, characterized in that before the formation of the implanted pocket region (7), another implantation of inert ions is applied that introduces amorphous silicon into the semiconductor body at least in a region beyond an intended projected range of the implanted pocket region (7).

5. Method according to claim 3, characterized in that for the implantation of inert ions, ions are chosen from a group comprising Ge, Si, Ar or Xe.

6. Method as claimed in claim 1, characterized in that for the ions of the implanted pocket region (7) In ions are chosen.

7. Method as claimed in claim 1, characterized in that the first annealing process is done at a temperature between 550 and 650 degrees Celsius and the second annealing process is done at a temperature higher than about 900 degrees Celsius.

8. Method as claimed in claim 7, characterized in that the second annealing process is a rapid thermal annealing process to obtain flash or spike activation of the pocket region (7).

9. Method as claimed in claim 1, characterized in that the pocket region (7) and the extensions (2A, 3A) of the source (2) and drain (3) are formed at the same stage of the manufacturing of the semiconductor device (10).

* * * * *